(12) United States Patent
Kebichi et al.

(10) Patent No.: US 7,424,660 B2
(45) Date of Patent: *Sep. 9, 2008

(54) SYNCHRONIZATION POINT ACROSS DIFFERENT MEMORY BIST CONTROLLERS

(76) Inventors: Omar Kebichi, 6107 Stearns Hill Rd., Waltham, MA (US) 02451; Wu-Tung Cheng, 19030 SW. 35th Pl., Lake Oswego, OR (US) 97034; Christopher John Hill, 14 Blenheim Close, Valley Park, Chandlers Ford, Hampshire, SO53 4LD (GB); Paul J. Reuter, 89 Rice Ave., Northboro, MA (US) 01532; Yahya M. Z. Mustafa, 7925 SW. Vlahos Dr., #520, Wilsonville, OR (US) 97070

( * ) Notice: Subject to any disclaimer, the term of this patent is extended or adjusted under 35 U.S.C. 154(b) by 98 days.

This patent is subject to a terminal disclaimer.

(21) Appl. No.: 11/397,822

(22) Filed: Apr. 3, 2006

(65) Prior Publication Data

US 2006/0190789 A1   Aug. 24, 2006

Related U.S. Application Data

(63) Continuation of application No. 09/872,212, filed on May 31, 2001, now Pat. No. 7,036,064, and a continuation-in-part of application No. 09/737,620, filed on Dec. 14, 2000, now Pat. No. 6,671,843.

(60) Provisional application No. 60/261,991, filed on Jan. 16, 2001, provisional application No. 60/248,337, filed on Nov. 13, 2000.

(51) Int. Cl.
*G01R 31/28* (2006.01)
*G06F 11/00* (2006.01)

(52) U.S. Cl. .................. 714/744; 714/731; 714/733; 714/734

(58) Field of Classification Search ................ None
See application file for complete search history.

(56) References Cited

U.S. PATENT DOCUMENTS 6,415,403 B1   7/2002   Huang et al.

(Continued)

OTHER PUBLICATIONS

MBIST Architect Reference Manual, V8.8_1.100, Sep. 2000, Chapter 1—Introduction.

(Continued)

*Primary Examiner*—Guy J Lamarre
(74) *Attorney, Agent, or Firm*—Klarquist Sparkman, LLP

(57) ABSTRACT

A circuit is disclosed for testing memories using multiple built-in self test (BIST) controllers embedded in an integrated circuit (IC). The BIST controllers are brought to a synchronization point during the memory test by allowing for a synchronization state. An output signal from an output pin on the IC indicates the existence of a synchronization state to automated test equipment (ATE). After an ATE receives the output signal, it issues a resume signal through an IC input pin that causes the controllers to advance out of the synchronization state. The ATE controls the synchronization state length by delaying the resume signal. Synchronization states can be used in parametric test algorithms, such as for retention and IDDQ tests. Synchronization states can be incorporated into user-defined algorithms by software design tools that generate an HDL description of a BIST controller operable to apply the algorithm with the synchronization state.

18 Claims, 9 Drawing Sheets

U.S. PATENT DOCUMENTS 6,421,789 B1 7/2002 Ooishi
6,651,202 B1 11/2003 Phan
7,036,064 B1 * 4/2006 Kebichi et al. .............. 714/744

OTHER PUBLICATIONS

MBIST Architect—Anatomy of the BIST Controller, published by Mentor Graphics Corporation, Apr. 1999.

MBISTArchitect Reference Manual, V8.9_1.10, Defining the Model—DFT Library Modeling for Memories, Dec. 2000.

MBIST Architect—UDA Kernel Design, published by Mentor Graphics, Apr. 1999.

Burgess, "Test and Diagnosis of Embedded Memory Using BIST," *EE-Evaluation Engineering*, Mar. 2000.

Mentor Graphics, "Built-In Self-Test Process Guide, Software Version 8.9_1.10," Dec. 2000.

* cited by examiner

N MULTIPLE BIST CONTROLLERS WITH N MULTILPLE HOLD PINS

TEST ON THREE MEMORIES COUPLED TO A SINGLE SEQUENTIAL BIST CONTROLLER USING THREE SEPARATE IDLE PERIODS (PRIOR ART)

N MULTIPLE BIST CONTROLLERS WITH SINGLE SYNCHRONIZE AND RESUME PINS

TEST OF MEMORIES WITH MULTIPLE PARALLEL BIST
CONTROLLERS USING SYNCHRONIZATION STATE (CONTINUED)

TEST OF MEMORIES WITH MULTIPLE SEQUENTIAL BIST CONTROLLERS USING SYNCHRONIZATION STATE (CONTINUED)

GENERATING A BIST CONTROLLER THAT RUNS USER DEFINABLE ALGORITHMS WITH SYNC KEYWORD

US 7,424,660 B2

SYNCHRONIZATION POINT ACROSS DIFFERENT MEMORY BIST CONTROLLERS

RELATED APPLICATION DATA

This application is a continuation of U.S. patent application Ser. No. 09/872,212 filed May 31, 2001, now issued as U.S. Pat. No. 7,036,064 on Apr. 25, 2006, and is a continuation-in-part of U.S. patent application Ser. No. 09/737,620, filed Dec. 14, 2000, now issued as U.S. Pat. No. 6,671,843, issued Dec. 30, 2003, and which claims priority to U.S. Provisional Patent Application No. 60/261,991, filed Jan. 16, 2001, and U.S. Provisional Patent Application No. 60/248,337, field Nov. 13, 2000, all of which are hereby incorporated by reference.

TECHNICAL FIELD

This invention generally relates to built-in self testing of electronic circuits and, more particularly, to built-in self testing of memory circuits such as embedded memories within an integrated circuit, memories on a multichip module, or off-chip memories.

BACKGROUND

Many of today's integrated circuit (IC) designs are a complete system on a chip (SOC) that includes a processor core, multiple embedded memories, logic, I/O ports, etc. Embedded memories are the densest components in a SOC, accounting for up to 90% of the chip area. Memories are also the most sensitive to manufacturing process defects, making it essential to thoroughly test them in a SOC. As IC's are produced with greater levels of circuit density, efficient testing schemes that guarantee very high fault coverage while minimizing test costs and chip area overhead have become essential. However, as the complexity of circuits continues to increase, and as the number of memory circuits that can be packed into a chip of a given size increases, the need for efficient and cost effective testing of embedded memories has increased. Built-in self-test (BIST), has become the method of choice for testing embedded memories, although it can also be used to test external memories. To use BIST for testing embedded memories, one or more BIST controllers are inserted within the SOC during the chip's design. The insertion may be done using a software design tool. One such tool is MBIST Architect™, offered by the assignee. The chip is then fabricated with the added BIST controllers. During testing of the fabricated chip, a BIST controller is instructed to supply a series of patterns to the ports of an embedded memory. These patterns, also called test algorithms, typically include but are not limited to march-type and checkerboard-type patterns that cause a memory to produce deterministic output data. The output data can be directly compared with input reference data from the controller. Alternatively, the output from the memory can be compressed and checked against a reference signature provided by the controller. In either case comparison generates a signal indicating that the memory passed or failed a test.

The time required to test memories is largely impacted by the size of the memory (i.e., larger memories take longer to test) and by a type of testing where the memories sit idle for a period of time. Examples of such tests where memories sit idle include retention tests, IDDQ tests, or other parametric tests. Such tests detect memory defects where a memory element appears to be functioning properly if written to and read from quickly, but over time the memory element loses its stored state. The loss of stored state could result from loss of charge on a charge-based storage element due to leakage currents. An example retention test fills memory with a pattern, waits a predetermined period of time (e.g., 100 milliseconds (ms)), and then reads the memory to check if the pattern is retained in memory. In the context of a retention test, the idle period may be called a "retention period".

IDDQ testing is based on the premise that a fault-free integrated circuit draws very little supply current in a steady state. Unwanted shorts can cause a power and ground connection that increases current consumption under certain conditions. The current drawn by a faulty device is often several orders of magnitude higher than that drawn by a good device. Like the retention test, the IDDQ test requires a period of time where the memory is not accessed so that the appropriate steady state currents can be measured.

FIG. 1 shows an example prior art testing environment 10 for testing embedded memories that includes automated test equipment (ATE) 12 coupled to an IC 14. The IC 14 includes N BIST controllers (shown generally at 16) coupled in parallel. Each BIST controller is coupled to multiple memories to be tested. For example, a BIST controller 18 is coupled to the memories through data, address, and control lines. The memories 18, 20, 22 are shown having one or more output buses (shown generically at 26) coupled to the BIST controller 18. In the case where each memory has a separate output bus, the BIST controller 18 tests memories 20, 22, 24 in parallel and is called a "parallel" BIST controller. In the case where each memory has a shared output bus or the power budget prevents testing in parallel, the BIST controller 18 tests the memories one at a time (i.e., sequentially) and is called a "sequential" BIST controller.

To properly test the memories using retention or IDDQ tests, each BIST controller is coupled to a separate "hold" pin, such as hold pins 30, 32, on the IC 14. The hold pins are coupled to the ATE 12, which controls each hold pin individually. For example, when the ATE determines that BIST controller 18 is ready for a retention or IDDQ test, the hold pin 30 is asserted causing the BIST controller 18 to remain idle. The ATE then waits the desired amount of time and deactivates the hold pin allowing the BIST controller to continue the memory tests.

FIG. 2 illustrates a method for performing a retention test using BIST controller 18 as a sequential BIST controller to test multiple memories 20, 22, and 24. In order to test the memories, it is necessary for an ATE operator to perform an initial setup. For example, in process block 40, the ATE operator calculates when to assert the hold for each of three memories. The calculation generally involves multiplying the number of clock cycles necessary for a write operation by the number of memory addresses in each memory. Once the test starts, the BIST controller writes a pattern to the first memory (process block 42). After enough time has passed for the BIST controller to finish the writes to the first memory (as computed by the ATE operator), the ATE asserts the hold pin 30 (process block 44). With the hold pin activated, the BIST controller suspends accesses of memory for the retention period setup by the ATE operator. At the end of the retention period (for example, 100 ms) the ATE deactivates the hold pin to end the retention period (process block 46). The BIST controller then reads from the first memory and compares the read data to the previously written data (process block 48). The BIST controller then writes to the second memory (process block 50) and repeats the hold and read processes for the second memory (process blocks 52 to 56). This process is then repeated for the last memory (process blocks 58 to 64).

There are several disadvantages to the above-described memory testing technique. Foremost, the IC must allocate a hold pin for each BIST controller embedded in it. Multiple BIST controllers translate to multiple hold pins on the IC, which may require a larger, more expensive IC to accommodate the multitude of hold pins. Additionally, each hold pin is controlled by a separate channel on the ATE. Thus, larger and more expensive ATEs having sufficient channels are required for ICs having a large number of BISTs. There is also a computing burden placed on the ATE operator. The ATE operator has to perform a calculation for each memory. As noted above, the calculation is basically the number of clock cycles for a write multiplied by the number of addresses in the memory being tested. The calculation is a hardship not just because of the time factor, but also because the calculation must be very precise. An error of plus or minus one clock cycle in asserting the hold signal may lead to an error in the retention test.

A disadvantage that exists in prior sequential tests is that the overall testing time can be large because there is a separate retention period (process blocks 44, 52, and 60) for each memory tested. In a sample test the total memory access time might be 10 ms for each memory—30 ms for all three memories. Assuming the retention period is 100 ms, then the overall retention time is a relatively long 300 ms.

Therefore, there is a need for BIST technology that can perform retention tests and other tests using idle periods in an efficient manner.

SUMMARY

A memory test environment is disclosed wherein an external tester, such as an ATE, uses a single "resume" input pin on an IC to control multiple BIST controllers. A "synchronize" state allows a BIST controller to put itself into an idle state to suspend memory accesses. Activating the resume pin causes the BIST controllers to continue the memory testing by exiting the synchronize state. Additionally, feedback is provided from the BIST controllers to alert the ATE when a memory test is completed, which reduces the setup required by an ATE operator.

In one aspect, the synchronization state may be included by the designer in a user-defined algorithm. When a BIST controller enters the synchronization state, it remains idle without the need for ATE operator calculations or hold pins to initiate the synchronization state.

In another aspect, the single input pin (resume pin) on the IC is coupled to multiple BIST controllers. Using the resume pin, the ATE sends a signal to two or more BIST controllers in parallel causing them to exit a synchronization state and continue testing memory. Thus, multiple hold pins are not required, which saves IC pins and ATE channels.

In yet another aspect, a single output pin (synchronize pin) on the IC is coupled to the ATE, through which a feedback signal is sent to the ATE indicating that the BIST controllers are in a synchronization state.

In another aspect, a method is disclosed for testing multiple memories with a single sequential BIST controller, wherein the multiple memories are brought to a common synchronization point during the memory testing.

In yet a further aspect, instead of using synchronize and resume pins, the equivalent signals associated with these pins may be routed internally within the IC to interface with other testing logic.

The foregoing and other aspects of the invention will become more apparent from the following detailed description of exemplary embodiments that proceeds with reference to the following drawings.

DETAILED DESCRIPTION

Apparatus for Testing Memories with Synchronization States

Figure 1:
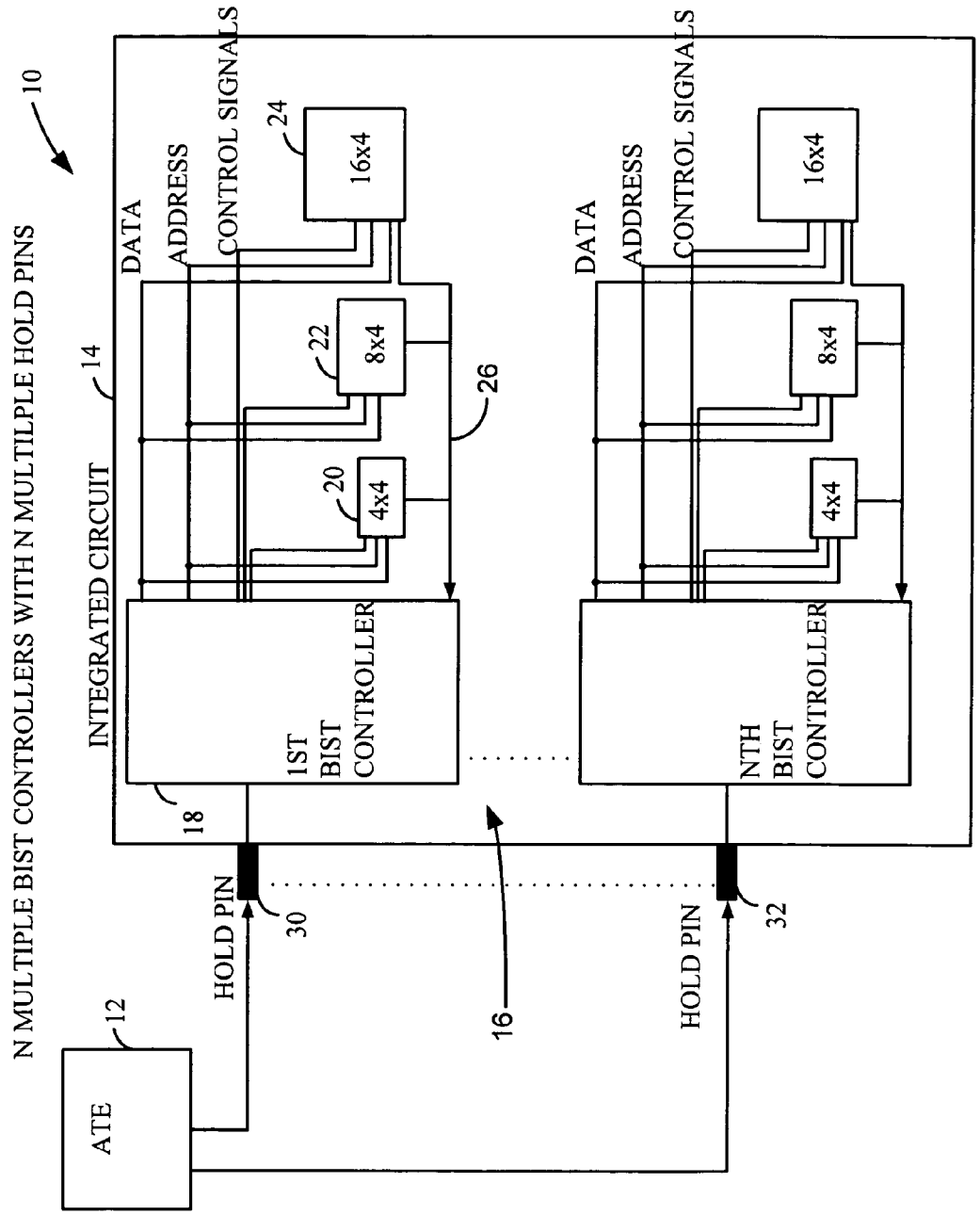
FIG. 1 is a prior art test environment with multiple BIST controllers controlled by multiple hold pins.
Figure 2:
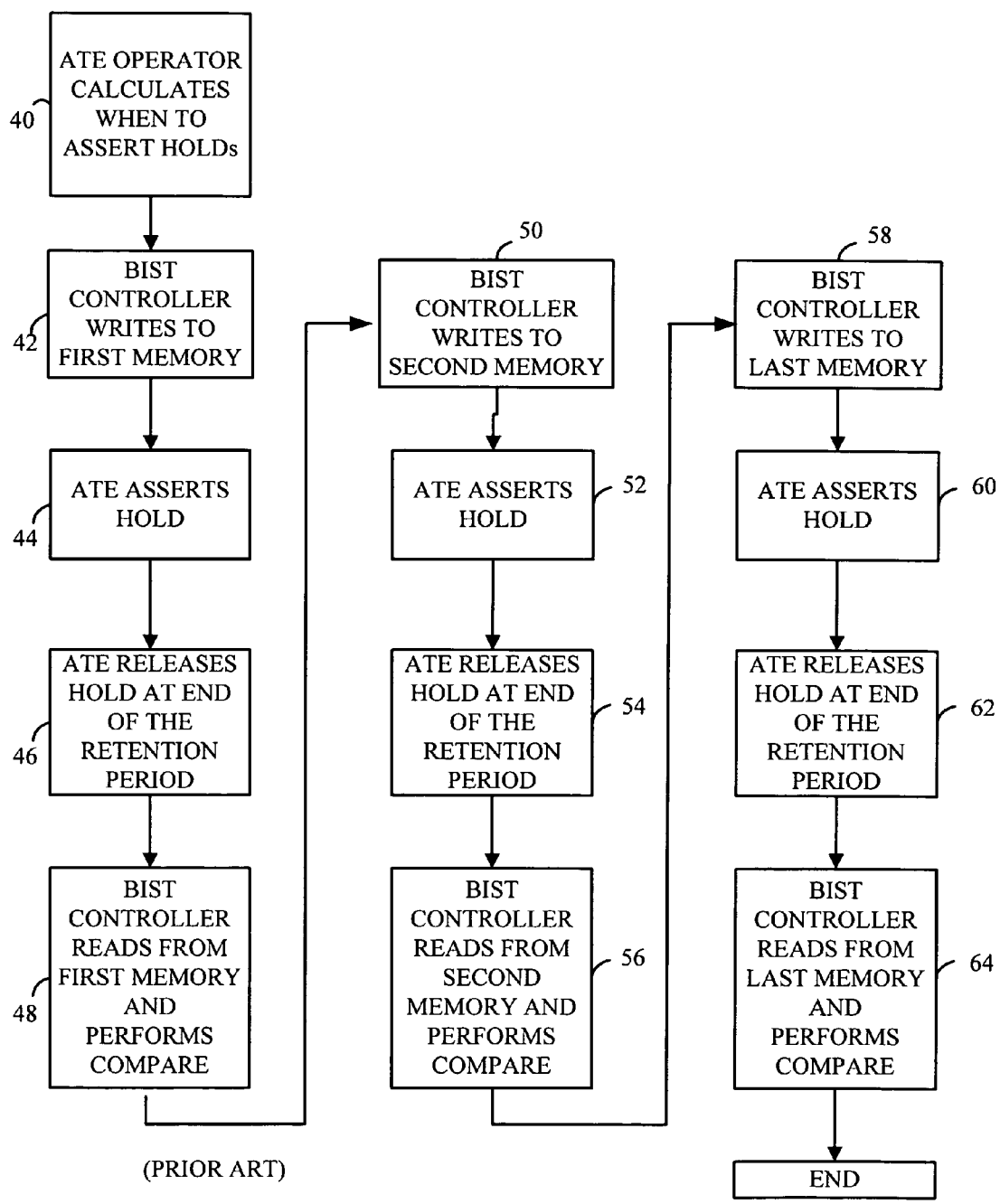
FIG. 2 is a flow chart of a prior art method for performing a retention test on multiple memories with a sequential BIST controller.
Figure 3:
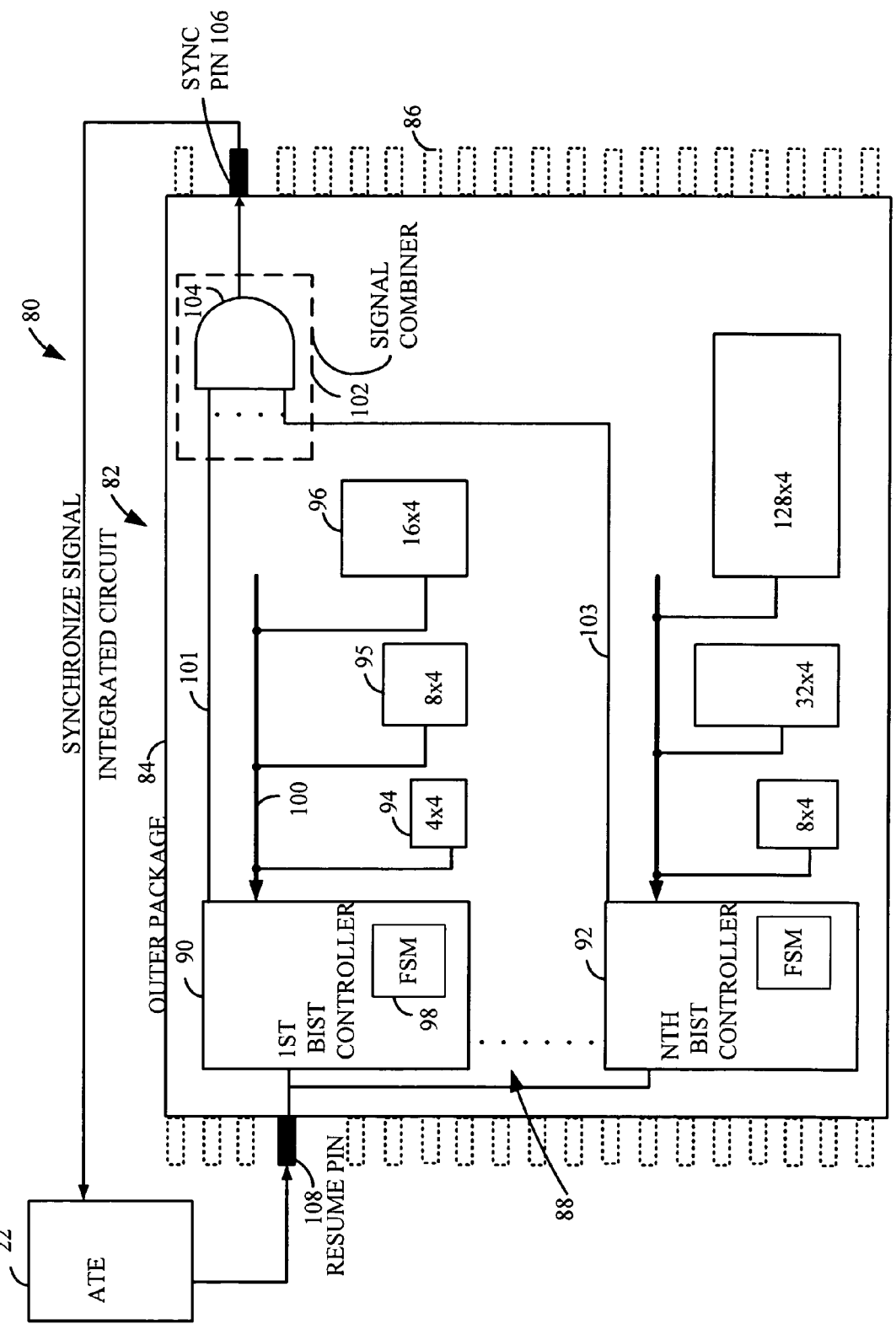
FIG. 3 is a circuit diagram illustrating an IC with multiple parallel BIST controllers controlled through a single resume pin and providing feedback to the ATE through a synchronization signal, in accordance with one embodiment of the invention.

FIG. 3 shows a test environment 80 including an ATE 12 coupled to an IC 82. The IC is shown generally having an outer package 84 with input/output pins (shown in phantom), such as pin 86. The IC includes N BIST controllers 88, wherein only the first BIST controller 90 and Nth BIST controller 92 are shown for simplicity. The N BIST controllers 88 are used to test multiple memories of varying size embedded within the IC, such as memories 94-96. The BIST controllers 88 have a similar architecture. For example, BIST controller 90 includes a finite state machine (FSM) 98 having a series of memory test algorithm states. One or more of these states is a synchronization state in which the controller 90 remains idle or does not otherwise access memories, as further described below.

BIST controller 90 performs memory tests on the memories 94-96, which vary in size. Any desired number of memories and any size of memory can be used. For clarity, only output data bus 100 is shown coupling the BIST controller 90 to the memories. The data bus 100 can be parallel buses in the case of a parallel BIST controller or a shared bus in the case of a sequential BIST controller.

The BIST controllers 88 have synchronization feedback outputs, such as 101 and 103 from BIST controllers 90, 92, respectively. The synchronization feedback outputs 101, 103 carry signals indicating that their respective controller is in a synchronization state. For example, synchronization output 101 is activated (i.e., may be active high or low) when the BIST controller 90 has completed a phase of the memory test. The synchronization feedback signals are coupled to an N input signal combiner 102. In the illustrated embodiment, the signal combiner 102 includes an AND gate 104, but other logic gates or combinations of logic gates can be used. The BIST controllers 88 typically finish their respective phases of the memory testing at different times because they often test different numbers and sizes of memories than the other controllers. As each BIST controller activates its respective synchronization feedback signal, it remains in an idle state until the resume signal is activated, as described further below. When all of the BIST controllers 88 activate their respective synchronization feedback signals, the signal combiner output is activated (active high or low). The signal combiner output is transmitted through a single IC output pin (synchronize pin) 106 on the IC 82. Activation of the synchronization pin indicates that the multiple BIST controllers are at a common synchronization point. From the synchronize pin 106, the synchronize signal is passed to the ATE 12. Once the ATE 12 receives the synchronize signal, it tracks an elapsed time needed to complete this phase of the memory test. For example, the synchronization signals from the BIST controllers may be activated to indicate that the memories are ready for a retention test because the appropriate memory patterns have been written to the memories.

Once the synchronization pin 106 is activated, the ATE 12 determines when a sufficient amount of time has passed to start the read operations. After the desired delay, the ATE 12 asserts a signal through an input pin (resume pin) 108 to the controllers 88. The resume pin 108 is coupled in parallel to the BIST controllers and indicates that the BIST controllers can proceed to the next phase of the memory test. Thus, through a single channel on the ATE, multiple BIST controllers can be controlled by the ATE in parallel and in synchronization with each other.

One skilled in the art will also recognize that there are many possible variations that could be made without departing from the underlying principles. The length of the synchronization period may vary greatly depending on the test being performed. For example, if it is desired to coordinate the actions of the BIST controllers so that they can begin an algorithm simultaneously, the ATE may end the synchronization state virtually immediately. If a retention test is being performed, the ATE may wait between 50 ms to 150 ms or some other appropriate time period. Those skilled in the art will recognize that various lengths of time may be appropriate for a synchronization state depending on its purpose.

In some embodiments synchronization states may allow some types of memory accesses. For example, depending on testing needs, read access may be allowed, but not write access, memory refresh and/or memory updates. For a retention test, a synchronization state that does not allow memory refreshment, updates or writes, but that allows read access may be sufficient. On some memories (e.g., DRAM) a read operation will do a refresh or update, so read access during retention periods would be undesirable. For an IDDQ test, a synchronization state may be defined as one in which the controller 90 performs no memory accesses of any kind. One skilled in the art would appreciate that the FSM may define a synchronization test in a variety of ways depending on the testing needs.

The logic gates or signals used to implement an embodiment could vary. For example, although the input signals to the signal combiner 102 are active high, they could be active low. Also, while an AND gate 104 is shown as the signal combiner 102, signal combiners could be designed and built of other suitable or equivalent gates or combinations of gates. Further, while a separate output synchronize pin 106 and input resume pin 108 are shown, these could be combined into one bi-directional pin.

Further, the memories may include memories embedded in another IC or external memories. In systems testing, for example, the memories may include embedded memories or external memories located on the same or a different printed circuit board or other structure. Buses could be used to connect the BIST controllers 88 to such disparate memory elements through a pin on the IC 82. Also, the memories may be static random access memories (SRAM), dynamic random access memories (DRAM), read only memories (ROM or EEPROM), flash memories, or other memory types.

It should be noted that despite the difference in the size of their memories, the controllers share a common synchronization point beginning when the synchronize signal on pin 106 is activated. The above design therefore accommodates BIST controllers testing memories of different sizes.

It is also noteworthy that because there is only one resume pin, only one line is needed from the ATE to the IC to end the synchronize state. Multiple ATE lines to multiple hold pins are not needed.

Synchronization States Using Parallel BIST Controllers

Figure 4:
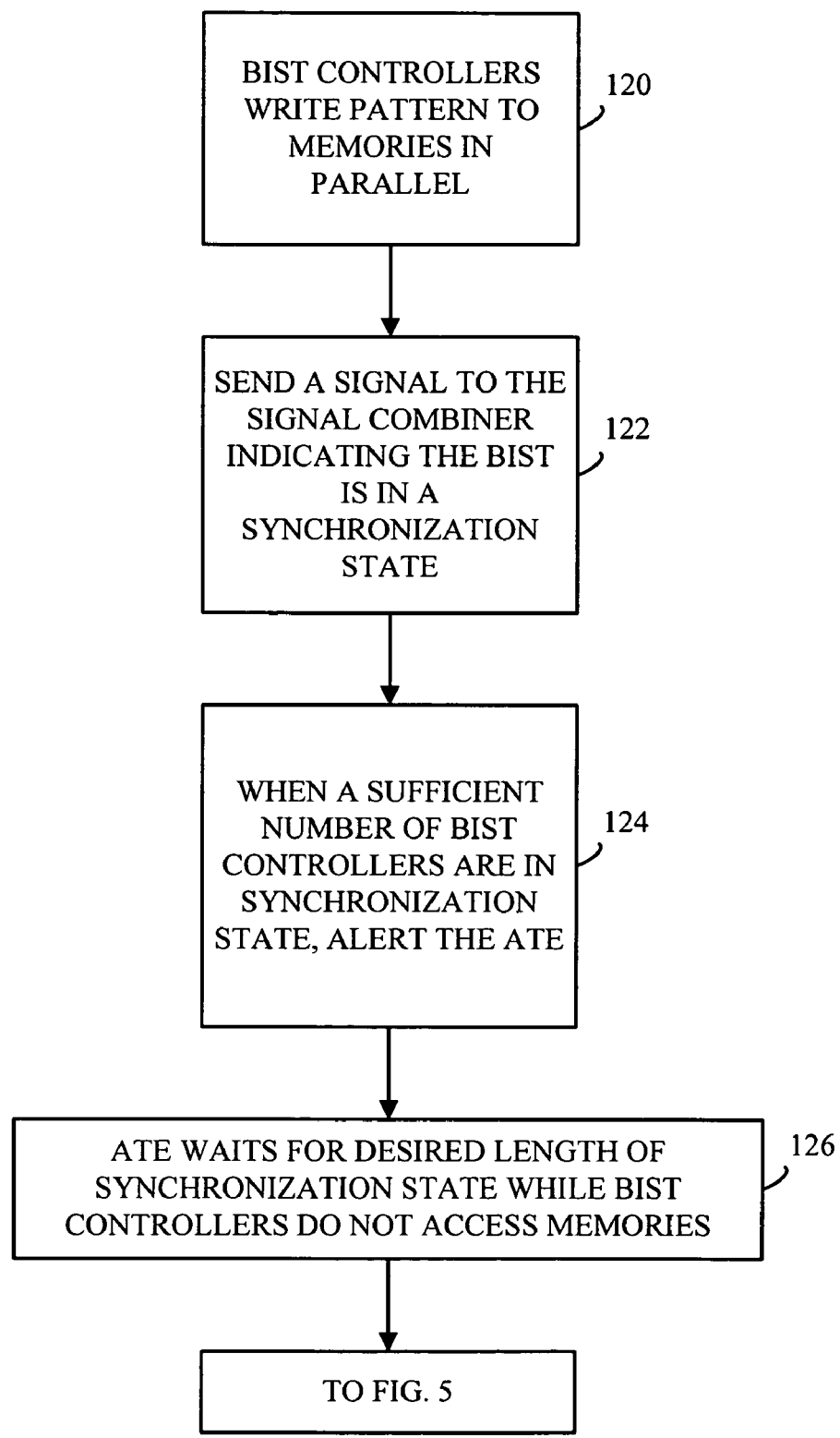
FIG. 4 is a flow chart of a method for performing a test of memories that includes synchronization states using multiple parallel BIST controllers.

FIG. 4 illustrates a possible method of testing memories using a sample algorithm that incorporates a synchronization state. In process block 120, the BIST controllers write a pattern to their respective memories in parallel. Thus, all memories sharing the same controller are written to in parallel. Each BIST controller may be writing a different pattern to its respective memories than the other BIST controllers.

At process block 122, a BIST controller finishes writing to its memories and activates its synchronization signal indicating that this particular controller is in a synchronization state. Other controllers likewise send a synchronization signal as they finish writing to their respective memories. When in a synchronization state, the BIST controller remains idle until the resume pin is activated. Thus, the BIST controllers are placing themselves in an idle state, rather than externally being held in an idle state through a hold pin.

At process block 124, a sufficient number of the parallel BIST controllers have finished writing to their memories and the ATE is alerted that the controllers are in a synchronization state. As illustrated in FIG. 3, one way this could be implemented is for the signal combiner to AND the signals and issue a synchronize signal when all the input signals agree on the existence of a synchronization state. Thus, the synchronize signal ensures that the BIST controllers reach a common synchronization point before the memory testing proceeds further.

At process block 126, the ATE, which has received the synchronization signal, waits a desired period of time, during which period of time, the BIST controllers do not access the memories. As previously discussed, this lack of access could be simply not writing to or updating the memories. The precise definition of what constitutes not accessing the memories could vary depending on the needs of the particular test algorithm. Also as previously discussed, the desired length of the synchronization state could vary depending on the needs of the particular test algorithm (e.g., a retention test may need 100 ms while an IDDQ test might just a few ms). The length of the desired period of time could be preprogrammed into the ATE.

Figure 5:
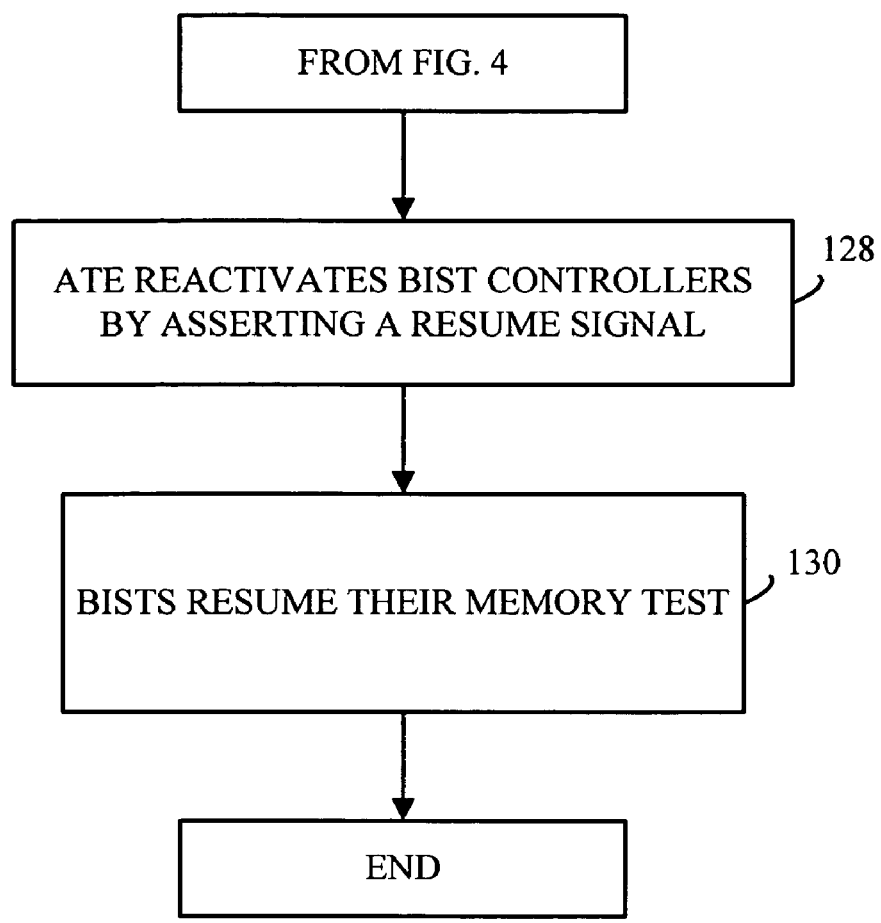
FIG. 5 is a flow chart of a method illustrating additional process blocks that may be used in conjunction with FIG. 4.

At process block 128 of FIG. 5, the ATE reactivates the BIST controllers by asserting a resume signal. This could be accomplished by asserting the signal through the single resume pin. However, in another possible embodiment, the BIST could be divided into groups, some of which receive a resume signal through one resume pin and others through a different pin. Different resume pins might be used if it was desirable for the synchronization states to be of different lengths because of differences in the controllers, the memories under test, or other factors.

Finally, at process block 130, the parallel BIST controllers resume their test of the memories. The remainder of the test could be virtually anything. For example, if a retention test is being performed, the BIST controllers may read from their memories in parallel and then do a compare.

A possible variation is that process block 124, alerting the ATE, could be performed when a group of BIST controllers are in a synchronization state, but other BIST controllers are not. The sample method could be implemented by one or more groups of controllers and not by other controllers or groups of controllers. One skilled in the art will recognize that one or more groups of controllers sharing an IC or even different IC's could be used to carry out this sample method and that other controllers on the IC's might not participate. Or different groups of controllers could have their respective synchronization states occur at different times or for different lengths of times. Circuits that implemented methods with these and other variations could easily be designed by one skilled in the art.

It should also be noted that while process block 120 is the first process in the sample method, the sample method could be taking place anywhere within a test algorithm. The process blocks outlined could be at the beginning, middle or end of any particular algorithm, depending on the particular test algorithm being used. Also, instead of ending at process block 130, the method may be repeated as many times as desired by starting again at process block 120.

Table 1, below, demonstrates an example of how process blocks 120 through 130 may be used as part of a larger sequence of states. An algorithm using a checkerboard pattern with a retention test is shown. To conduct this test, at 120, the BIST controllers write a pattern to their memories with hypothetical address 0 to (n−1). The pattern begins, 101010..., and continues in the same pattern until the memories are filled. Table 1 refers to this as "write(d)". The rest of the sequence 122-130, including entering and exiting a synchronization state, as shown in Table 1, synchronize is then be performed. A read ("Read (d)" in Table 1) and compare are then be performed. Process blocks 120 through 130 may then be repeated, only this time, at process block 120, the pattern that is written to the memories may be the inverse of the first pattern. It begins, 010101 ... and continues until the memories were filled. The writing of the inverse pattern is designated as "Write (db)" in Table 1. The remaining process blocks elements of the sequence, 122-130 may then be performed as shown in Table 1. As before, a read ("Read (db)" in Table 1) and compare may be performed after process block 130. The end result is that the memories are tested writing a pattern waiting a retention period then reading the pattern, then writing the inverse of the first pattern, doing a retention period and then reading the inverse of the first pattern.

The test sequence depicted in Table 1 is just one example of how process blocks 120 through 130 may be utilized as part of a larger sequence of testing states. Another example, shown in Table 2, involves a March type pattern with an IDDQ test. In Table 2, one or more memories with hypothetical addresses 0 to (n−1) are written to ("Write (d)" in Table 2) and then brought to a synchronization state. An IDDQ test is then performed during the synchronization state. The test in Table 2 may be done with just process blocks 120 to 126 if no further testing was to follow. Or process blocks 128 and 130 may be added, if further testing is desired.

TABLE 2

| March Algorithm with IDDQ Application | |
|---|---|
| Write (d) | Synchronize |
| address 0 | and then |
| . | measure |
| . | IDDQ |
| . | |
| address n−1 | |

One skilled in the art will recognize that the testing shown in Tables 1 and 2 are not mutually exclusive. Both test algorithms may be included into a single test sequence in any desired order or frequency. One skilled in the art will also recognize that process blocks 120 to 130 may be modified in a variety of ways without departing from the underlying principles. Further some of all of these process blocks may be incorporated at any desired point in a wide variety of memory test algorithms.

Testing Memories Using Sequential BIST Controllers

Figure 6:
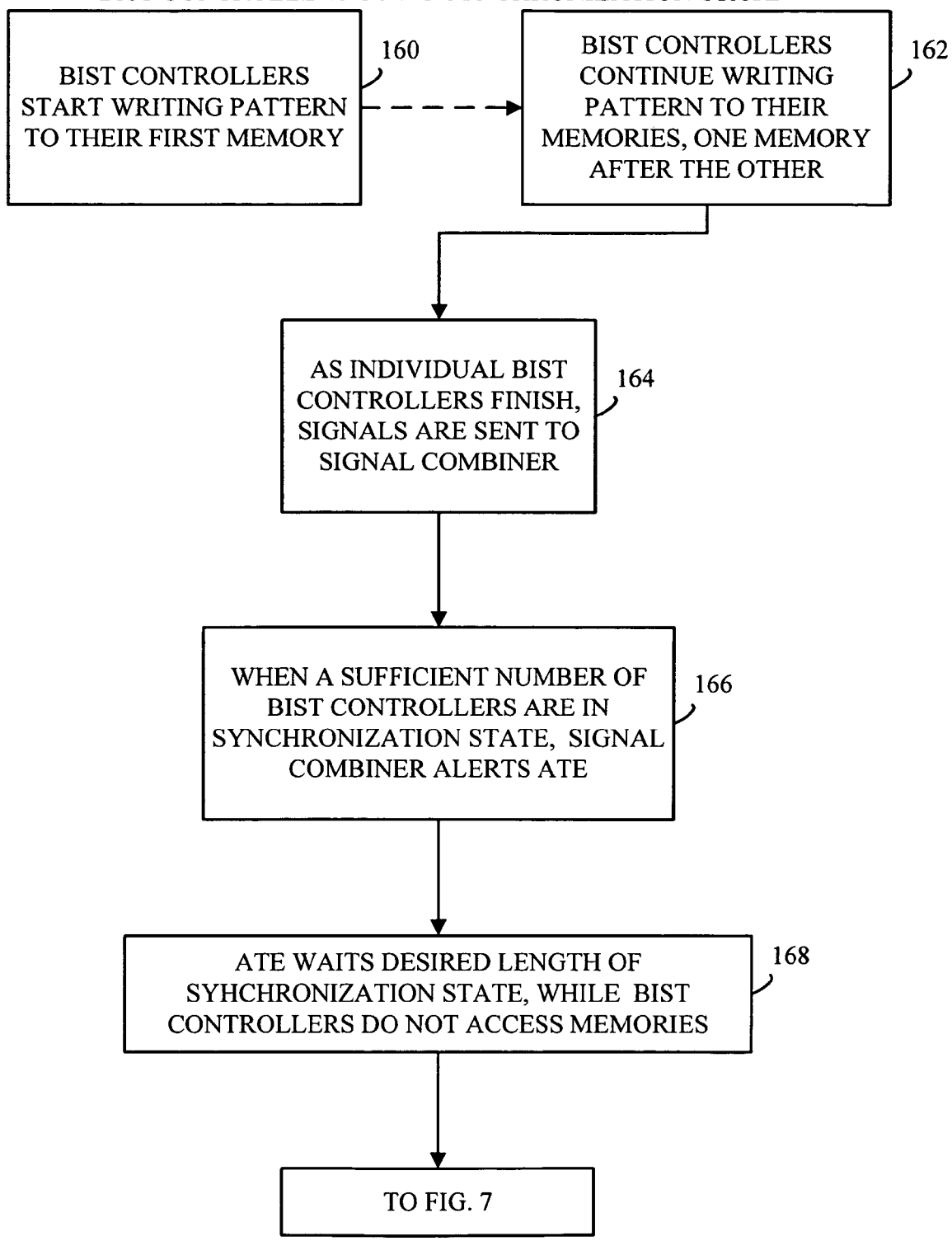
FIG. 6 is a flow chart of a sample method of performing a test of multiple memories that includes a synchronization state using sequential BIST controllers.

FIG. 6 illustrates a sample method of testing memories using a synchronization state with sequential BIST controllers. Sequential BIST controllers are used for a variety of reasons, including, for example, if an output data bus has to be shared by the controllers or if the power budget does not allow for parallel reads or writes of multiple memories.

At process block 160, the sequential BIST controllers start writing patterns to their first memory. For example, if there are N memories being tested by a sequential BIST controller, the pattern is written only to the first memory.

At process block 162, the sequential BIST controllers continue writing to their associated memories sequentially, one memory after the other. For example, if a sequential BIST is testing N memories, it will write the pattern to the second memory, then to the third memory, then to the fourth memory, and continuing in that manner until it has written the pattern to the Nth memory. It should be noted that the write operation, but not the entire test or algorithm, is performed sequentially. Performing test procedures in the above sequential manner,

TABLE 1

| Checkerboard Algorithm with Retention Test Application | | | | | |
|---|---|---|---|---|---|
| Write (d) | Synchronize and wait for resume | Read (d) | Write (db) | Synchronize and wait for resume | Read (db) |
| address 0 | | address 0 | address 0 | | address 0 |
| . | | . | . | | . |
| . | | . | . | | . |
| . | | . | . | | . |
| address n−1 | | address n−1 | address n−1 | | address n−1 | wherein individual test elements are sequentially performed across individual memories, may be referred to as interleaved sequential testing.

At process block 164, the individual sequential BIST controllers start finishing their writes to their respective memories and send synchronization signals indicating the completed writes.

At process block 166, a sufficient number of the sequential BIST controllers have completed process block 164 and the signal combiner alerts the ATE of the existence of a synchronization state. Thus, the sequential BIST controllers are brought to a common synchronization point before continuing memory testing.

At process block 168, the ATE waits a period of time while the BIST do not access their memories. As with parallel BIST controllers, multiple sequential BIST controllers share the same synchronization period.

Moreover, the synchronization period occurs in parallel with respect to multiple memories coupled to one of the sequential BIST controllers. Otherwise stated, there are no separate, sequential synchronization periods for different memories coupled to a sequential BIST controller. Instead, the memories share a synchronization state in parallel (they share a period of time when they are not being accessed by the controller).

At process block 170, the ATE brings the BIST controllers out of the synchronization state by asserting a resume signal through an IC input pin to the BIST controllers. As discussed above with regard to parallel BIST controllers, in this example, all of the BIST controllers receive the same resume signal through the same resume pin.

At process block 172, the sequential BIST controllers perform sequential reads of their respective memories. For example, a controller coupled to N memories reads its first memory, then its second memory, then its third memory, and continues reading one memory after the other until it reads its last (Nth) memory.

The sample method discussed above demonstrates instances of interleaved sequential memory testing, wherein an element of a test algorithm, such as a write or a read, is performed sequentially on the memories being tested by a sequential BIST controller. In interleaved sequential testing, a particular algorithm element is applied first to one memory, then to another, and so on until the element has been applied to the last of the memories being tested by the controller. Interleaved sequential testing can be contrasted with just performing the entire test sequentially; where all elements of an algorithm (rather than just a single element of the algorithm) are applied as a unit to one memory after the other.

It should be noted that process blocks 160 and 162, in which sequentially interleaved writes to memories are performed, can often be replaced by a parallel write to the memories. If the reason for using a sequential BIST controller is a shared output bus, and not the power budget, parallel writes to the memories are possible. The method of FIGS. 6 and 7 may then instead comprise a parallel write to the memories, a synchronization state, then a sequentially interleaved read from the memories. When they are possible, parallel writes to the memories are preferable to sequentially interleaved writes to the memories.

It should also be noted that while the read and writes in the above example are interleaved sequentially, the synchronization state is performed in parallel across the memories. There is only a single shared synchronization state for all the memories.

In addition, instead of ending at process block 172, the method may be repeated as many times as desired by beginning again at process block 160.

Overall SOC Design

When inserting various BIST controllers into an SOC design, each BIST controller is usually accompanied by a set of test patterns that properly initialize and run the BIST controller through its various steps. A final task to perform when adding these BIST controllers to the SOC design could be to integrate these test patterns into a single SOC test set. This could involve integrating sequential and parallel BIST controllers on the same IC and having their synchronization states coordinated to occur in parallel.

In order to support both the Parallel BIST and Sequential BIST schemes, the pattern integration process may support combining BIST patterns in a sequential manner and in a parallel manner. Further, the integration process may be able to combine various pattern sets per instance of BIST controller. With these capabilities in mind, we can create multiple pattern sets for each BIST controller. Each pattern set will be used for controlling the various test steps in the BIST controller.

For a Sequential BIST scheme, the "non-retention/IDDQ" pattern sets are combined sequentially, while the "retention/IDDQ" pattern sets are combined in parallel, so that all retention tests will happen only once for all memories.

For a Parallel BIST scheme, all pattern sets are combined in parallel. However all pattern sets leading up to the "retention/IDDQ" pattern set are padded with extra patterns so that all concurrent pattern sets would have the same length. This facilitates the option of having all BIST controllers on the SOC perform the "retention/IDDQ" test at the same time. However, a design could also include having some controllers share a synchronization state at the same time and others not. One skilled in the art would recognize that many permutations and variations of the above-disclosed embodiments could be designed and implemented without varying from the underlying principles.

Integration with JTAG

The MBIST test session can be controlled either through a JTAG controller or directly through the SOC chip pin. So, in the case of direct control, the SOC pattern will be applied as described above. In the case of JTAG, the SOC patterns could be applied as discussed below.

The memory BIST session may be divided into two phases: Phase 1 includes completing the write operation and observing the idle time. Phase 2 includes completing the read operation. Below is an algorithm to integrate with a JTAG IEEE 1149.1 standard compliant controller:

Step 1. Shift in the value needed to start the test.
Step 2. Compute N1, where N1 is the maximum number of cycles needed among all controllers to complete the write operation.
Step 3. Compute the idle time T (ex. retention time).
Step 4. Run the test for N1+T cycles. (i.e., N1 for completing a write operation and T for retention)
Step 5. Shift in the proper resume value.
Step 6. Compute N2, where N2 is the maximum number of cycles needed among all controllers to complete the read operation.
Step 7. Run the test for N2 cycles.
Step 8. Repeat steps 2-7 until the test is over.
Step 9. Shift out tst_done and fail_h values.

Steps 2 through 4 include precomputing the cycles needed for the write operation and for the idle time (N1+T cycles). Precomputing when to shift in the resume value may be necessary if the external tester is not capable of dynamically responding to feedback, such as a synchronize signal. Alternatively, where the external tester has this capability, the precomputing of steps 2 through 4 may be eliminated. Instead, a synchronize signal may be generated to notify the external tester that the controllers have finished the write operation and are in a synchronization state. The tester can then shift in the proper resume value after the desired idle time (T cycles).

User Definable Algorithms with Synchronization States

The above synchronization state technology can be incorporated into user-defined algorithms for testing memories (e.g., SRAM, DRAM, ROM, etc.). It is desirable to fabricate BIST controllers that incorporate user-defined algorithms that include one or more synchronization states. An illustrative embodiment for achieving this uses an electronic design automation (EDA) software tool in the form of a computer program that is stored on a computer-readable medium and executed on a computer system. The computer system can be of any type capable of executing such computer programs and including computer-readable media for storing computer programs. Background information on EDA tools is provided in a number of works including M. Abramovici et al., *Digital Systems Testing and Testable Design.* Computer Science Press, 1990; by V. D. Agarwal et al., *Test Generation for VLSI Chips.* Computer Science Press, 1988; and J. Rajski et al., *Arithmetic Built-In-Self-Test for Embedded Systems.* Prentice-Hall, 1998.

It is possible to design and fabricate BIST controllers with pre-coded test standard algorithms that can be replaced or supplemented with user-defined algorithms (UDAs). The standard algorithms are compiled into the software of the EDA tool and available upon the tool's activation, while these user-defined algorithms are typically loaded from stored files before or during the tool's execution. Traditionally, such user-defined algorithms have had a limited vocabulary (e.g., write and read). Using the present invention, the vocabulary is expanded to include a synchronization state. As a result, a user can design a BIST controller to perform customized algorithms that not only read to or write from memories, but that also include synchronization states. To accomplish this, a keyword such as "synchronization" or "sync" is used in the computer instructions.

A Software Design Tool

Figure 8:
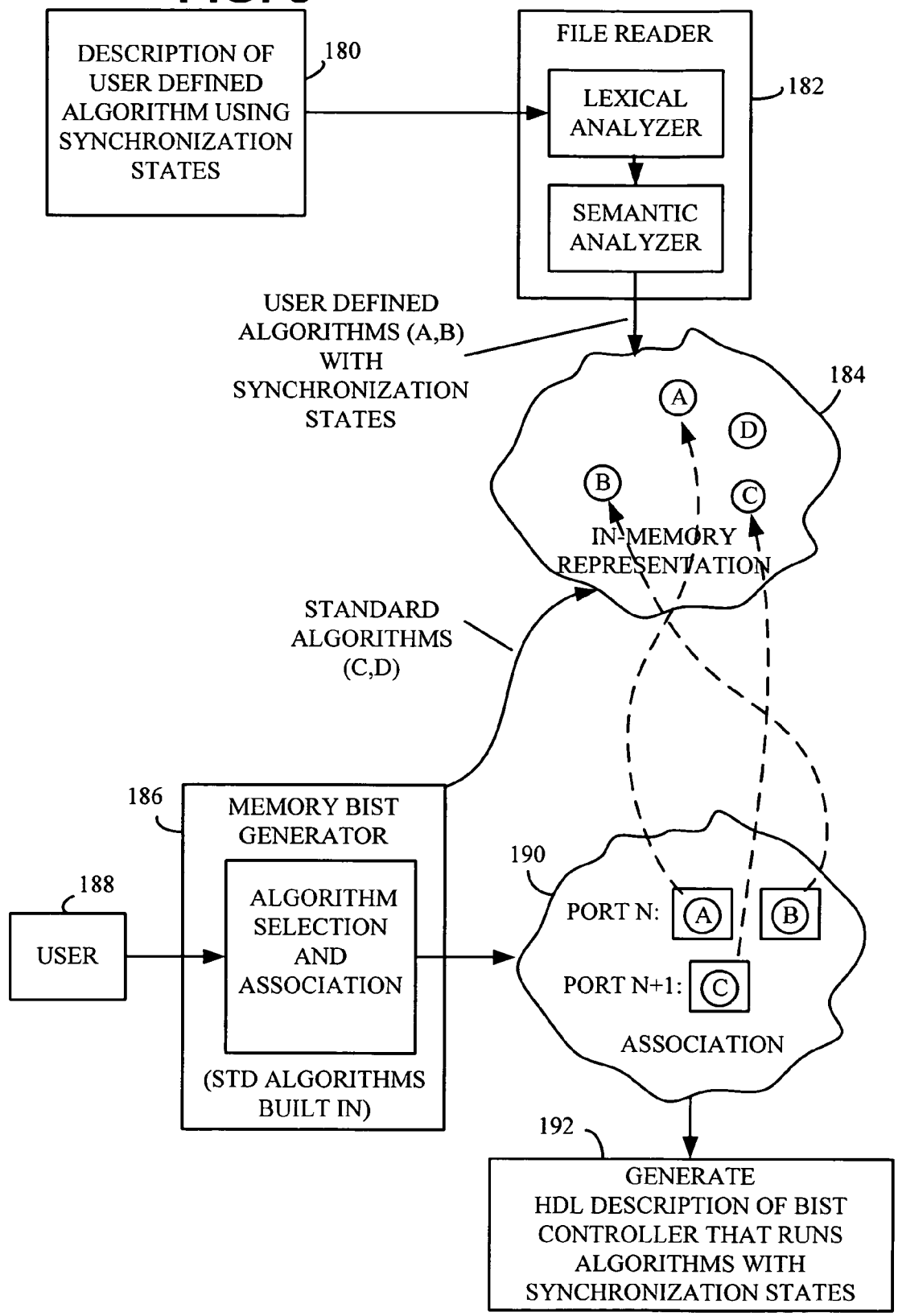
FIG. 8 is a block diagram of a software design tool that provides for synchronization states for BIST controllers that test memory within a circuit.

FIG. 8 is a block diagram of a software design tool as it is presented to a user by an active tool. The tool provides standard and user-defined algorithms for BIST controllers that test memory within a circuit. A file reader 182 within the tool is operable to read a description of a user-defined algorithm 180 supplied by the user in response to a user command. The user-defined algorithm 180, in this example, incorporates one or more synchronization states (e.g., using programming language keyword instructions such as "sync"). As with the standard algorithms, this description could be a graphical model, a text file, or other equivalents. The file reader translates the description of each user-defined algorithm into in-memory representations such as representations A and B in memory 184. Note also that in-memory representations of standard algorithms C and D are present. Algorithm representations C and D come into being on activation of the tool. Representations A-D are then available within the tool 186 for selection by a user 188. The tool responds to a selection by making the association 190 in memory and generating a BIST controller hardware description language HDL description 192. This HDL description is operable to apply the selected algorithms, including UDAs that include one or more synchronization states, to a memory corresponding to the selected memory model. The HDL description may be at the transistor level, as a gate level net list, as register transfer logic (RTL), etc.

Method of Designing BIST Controller with User-Defined Sync States

Figure 9:
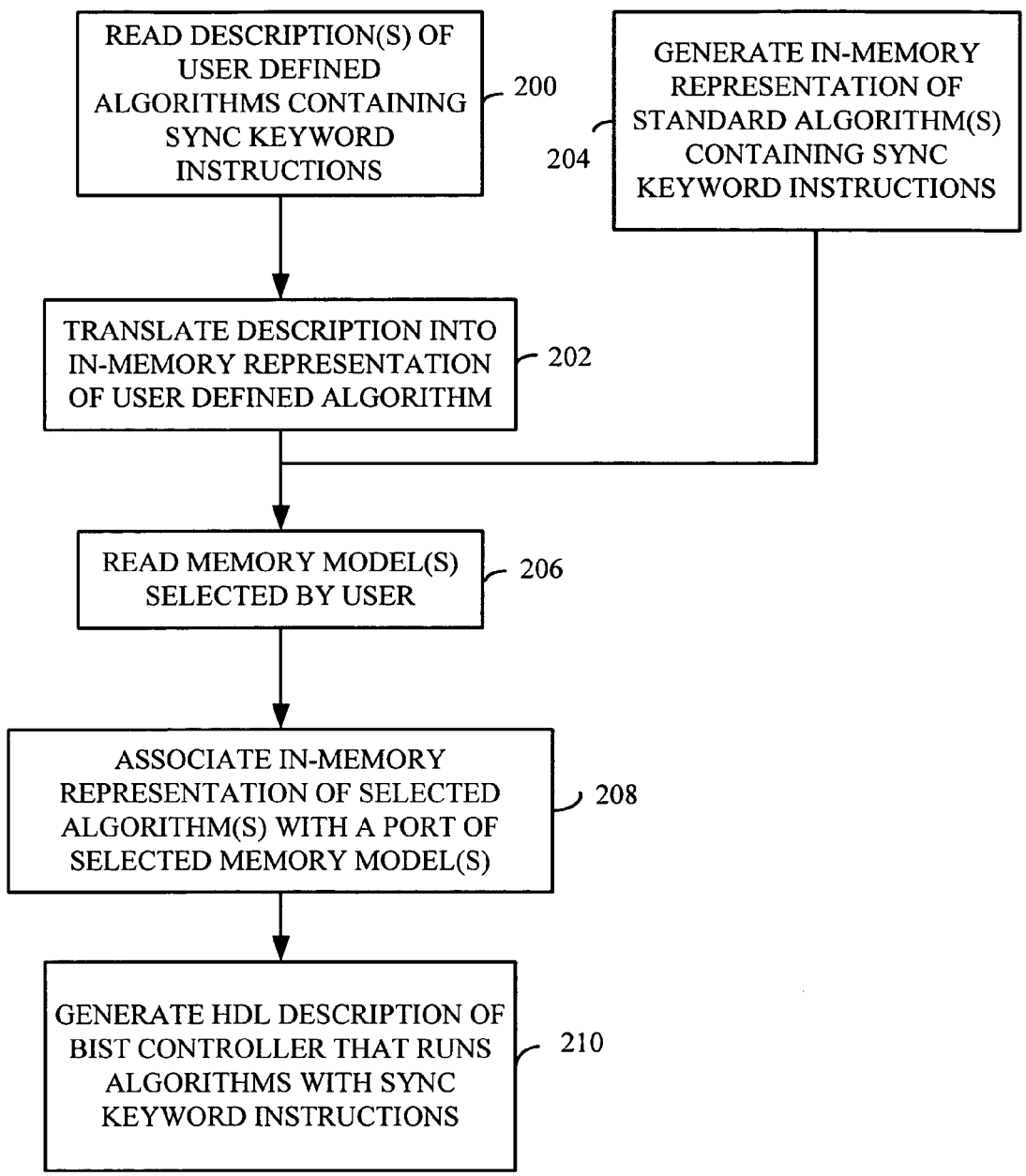
FIG. 9 is a flowchart of a method for providing synchronization states for a BIST controller that tests memory within a circuit.

FIG. 9 is a flowchart of a method followed by a tool such as in FIG. 8 for providing standard and user-defined algorithms, that include one or more synchronization states, to a memory BIST controller. It is best understood in conjunction with Table 3, which contains an exemplary pseudo code listing of user instructions to a software tool for performing the method of FIG. 9.

TABLE 3

Pseudo Code for Software Tool to Design BIST Controller load librarymylib.lib
add memory model ram 16 × 16 ram 27 × 10 . . .
add mbist algorithm 1 march 1, diagonal
add mbist algorithm 2 unique
run
save bist-verilog In response to a user command such as "load algorithm file1, file2. . . . " or other act, the tool reads one or more UDA descriptions (200) and translates each into an in memory representation (202). In contrast, in-memory representations of built-in standard algorithms are generated upon activation of the tool (204). The tool reads a list of memory models selected by a user such as "ram 16×16" from a library of memory models (206). The user, through instructions such as in Table 3, instructs the tool to associate certain algorithms with certain memory models (208). These algorithms can be standard or user-defined. In Table 3, for example, algorithms "march1" and "diagonal" are associated with memory models that have a port 1. Algorithm "unique" is associated with memory models that have a port 2. Assume that memory model ram16×16 has two ports and that memory model 27×10 has only one port. With these instructions, then, all three algorithms are associated with memory model ram16× 16 and only two algorithms are associated with memory model ram27×10. The tool is then run (210), which generates the BIST controller HDL description, and the description is saved.

It would be apparent to one skilled in the art from reviewing Table 3, and FIGS. 8 and 9 that multiple memory models may be associated with multiple in-memory representations of a user-defined algorithms. Further, a memory model may be associated with in-memory representations of multiple user-defined algorithms and an in-memory representation of a user-defined algorithm may be associated with multiple memory models. The capability for making associations may be designed to be very flexible.

It should be understood that the steps shown in FIG. 9 need not be taken in the sequence shown. For example, the user-defined algorithms can be read and translated before or after memory models are selected.

General Structure of UDAs with Synchronization States

The UDA capability allows a user to define algorithms using the same language with which the standard algorithms are defined. As noted above, the standard algorithms are built into the software during the software build process.

Table 4 shows an exemplary structure for a user-defined algorithm, taken from a standard algorithm. Note that under "operation" there is code not only for w (write to memory) and r (read to memory) but also "synchronization" for synchronization state.

TABLE 4

Sample User-Defined Algorithm with Synchronization States

```
step wCheckerBoardUp;
    data checkerboard;
    addr min, max, up, 1;
    operation w;
step synchronization
    data null;
    addr null, null, null, 0;
    operation null;
step rCheckerBoardUp;
    data checkerboard;
    addr min, max, up, 1;
    operation r;
step wInvCheckerBoardUp;
    data invcheckerboard;
    addr min, max, up, 1;
    operation w;
step synchronization
    data null;
    addr null, null, null, 0;
    operation null;
step rInvCheckerBoardUp;
    data invcheckerboard;
    addr min, max, up, 1;
    operation r;
repetition checkerBoardRetention;
    seed value
begin
    step wCheckerBoardUp;
    step synchronization;
    step rCheckerBoardUp;
    step wInvCheckerBoardUp;
    step synchronization
    step rInvCheckerBoardUp;
end
test checkerBoardRetention;
    repetitioncheckerBoardRetention;
```

Other structures or keywords may, of course, be used. The source code of the standard algorithms built within a tool is accessible to a user (although it cannot be changed). A user can make changes to a copy of a standard algorithm source file, and the tool will save the changed copy as a user-defined algorithm description.

A test algorithm description constructed in accordance with the invention has certain structure and elements, as shown in the table. A "test" element is the root of the algorithm description. It references a number of "repetitions." A repetition element aggregates a number of test algorithm activities using a common data seed value. It references a number of "steps." Steps form the body of a test algorithm. Each step, other than a synchronization step, performs a single pass across the address space of the memory performing a single activity at a variety of addresses. The order of elements in an algorithm definition file is declared before use. Multiple references may be made to different elements previously declared. All elements described in an algorithm definition file are locally scoped, except for algorithm definitions. It is quite permissible for multiple files to contain different definitions of a particular repetition or step. These elements will not clash and the one from the file will be used by all subsequent references in the file. However the globally scoped test algorithm definition may cause an already defined algorithm to be replaced.

The Test Element

More specifically, the test element forms the root of the algorithm. It gives the algorithm the name that it is known by. A test element references a number of repetitions that form the body of the algorithm. A test element, or declaration, has the following form:

```
test name;
    compress;
    compare;
    preclude other_name;
    begin
        repetition name;
        repetition name;
    end
```

The compare and compress clauses are optional and mutually exclusive. They inform the tool that the algorithm can only be used with a controller configured with a compressor or comparator respectively. The default if neither of these keywords is used is that the algorithm can be used in a BIST controller with either a compressor or comparator. The preclude clause names another algorithm that this algorithm is incompatible with. The tool generates an error message if the user tries to create a BIST controller that contains algorithms that preclude each other. The begin and end keywords surround the body of the algorithm declaration, a sequence of repetition references. If there is only a single repetition reference, then the begin and end keywords are unnecessary.

The Repetition Element

The repetition element forms an aggregation of the steps of an algorithm. Usually these steps share a common seed value, defined as part of the repetition. A repetition element, or declaration, has the following form:

```
repetition name;
    seed value;
    ld r1, source;
    ld r2, source;
    begin
        step name;
        step name;
    end
```

The seed definition defines a common default seed value, to be used by all of the steps referenced from the repetition. The ld clauses are optional. If the data registers are used by the algorithm, then these clauses can be initialized by the repetition. The begin and end keywords surround the body of the repetition declaration, a sequence of step references. If there is only a single step reference then the begin and end keywords are unnecessary.

The Step Element

A step declares basic activity across the address space of the memory ports the algorithm is applied to. A typical step has the following form:

```
step name;
    addr end1, end2, direction, increment;
    data source;
    operation value;
```

The addr clause defines what happens to the address register during the step of the algorithm. It is this clause that defines the address sequence visited during the step of the algorithm. The data clause defines what data values will be used by the operation applied at each address of the address sequence visited by the algorithm step. The operation clause defines the activity that is performed at each address of the address sequence that is visited by the algorithm step.

When defining a synchronization step, a keyword such as "synchronization" is used in the initial step preamble, as shown in Table 4. The "synchronization" statement causes the BIST controller to activate a synchronization signal, such as signal 96 (FIG. 4). Additionally, the BIST controller suspends memory accesses until the resume signal input (see FIG. 4 at 108) is activated.

Address Sequences

The addr clause of a step definition describes what address sequence is used for the step. The exact sequence is controlled by the parameters of the clause. The end1 and end2 values can be either an explicit numeric address or one of the symbolic values min or max, which correspond to the lowest and highest addresses that the BIST controller will be able to access. Together the end1 and end2 values define the bounds of the address sequence to be traversed. The direction value is either up or down, depending on the direction the address space is to be traversed. The last parameter incr defines the step size used to traverse the address space. This can be either a simple numeric value or the symbolic value jump. If the step is a synchronization step, the values described above associated with addr may simply be set to null, zero or other value indicating the usual values are not applicable, again depending on the particular programming language implementation.

Data Sources

The data clause of a step definition defines the type of data that will be used during the memory accesses of the step. The simple source values include the following:

Seed. The data seed value, obtained from the repetition referencing this step, is used. It is an error for the referencing repetition not to define a step. Invseed. The inverse bit pattern of seed will be used.

Background. When data background values are defined, the tool instantiates the complete test algorithm once for each value. The current background value will be used as the data pattern. If no backgrounds are defined then the seed value from the referencing repetition is used.

Invbackground. The inverse bit pattern of background is used.

Checkerboard. A suitable checkerboard value will be used. The exact type and value depends on how the memory is modeled.

Invcheckerboard. The inverse of checkerboard data is used.

Addr. An address unique data value is computed and used. For memories that have more address bits than data bits this will be an additive reduction of the address bits. For memories that have more data bits than address bits this will be a catenation of the address.

Invaddr. The inverse of addr data is used.

When performing a memory access that performs multiple write activities the data pattern used will be inverted upon each write. If only a read is being done then the data expected is the data defined by the step. However, for more complex memory access operations, featuring a mixture of read and write activities, the data value expected to be read will be the value written by the last write activity. Except where the read occurs before the first write, in which case the data will be the inverse of the data that will be written by that first read. So, for example if the data is 'b0000 then a RWR operation will expect 'b1111, write b0000 and finally expect 'b0000. The WRWR operation will write 'b0000, expect 'b0000, write 'b1111 and expect 'b1111.

Operations

The operation clause of the step defines the memory access operation that is to be performed at each address of the address sequence to be used by the step. It can be defined using only a string of R and W characters to correspond to a read or write activity. So, a read write read activity will be represented as operation RWR. When the step is executed by the BIST controller the entire operation will be performed at each address of the address sequence, before the controller moves to the next address in the sequence. As shown in Table 4, the operation clause can be defined as a synchronization step, for example by a keyword such as "null" (for no operation) used in Table 4 or "sync" or some other term.

Simple operations such as a single read or write activity are taken from a description of the read or write cycle of the memory port in the memory model. More complex operations, those that have a combination of read and write activities, will be synthesized from the simple read and write cycle definitions contained in the memory model.

Cycle synthesis uses the following heuristic. Take each read and write activity of the complex operation sequentially and locate the corresponding cycle definition from the memory model. Take the activity of the cycle definition and append it to the cycle being synthesized. After the cycle has been appended ensure that there is a period of rest and inactivity at the end of the cycle. User-defined complex cycles in the memory may also be supported. The default action is then use of this cycle definition in preference to the synthesizing it.

It will be clear to those having skill in the art that many changes may be made to the above-described embodiments of this invention without departing from the underlying principles thereof. Examples of variations that may be present in various embodiments include the following:

Although the external test equipment is described as an ATE, it will be recognized that other types of external test equipment may be used.

Another possible embodiment may use the disclosed synchronization capability with the prior art hold functionality. In this embodiment, a BIST controller contains both synchronization and hold behavior, in which case the hold behavior dominates. In that case, when the hold input is asserted during a synchronization state, any subsequent resume input is ignored until the hold input is deactivated.

Additionally, although the synchronization signal and resume signal are shown working in cooperation, each may be used independently without the other. Thus, the invention may include a resume signal without having a synchronization. Alternatively, a synchronization may be used without the resume signal.

If a resume signal is used without a synchronization signal, the ATE operator may calculate the number of clock cycles the test needs to run. The calculation may include both the cycles needed for memory accesses and for the synchronization state. The ATE may then assert the resume signal to end the synchronization period at the end of the calculated period.

While an external resume pin 108 and an external sync pin 106 are illustrated in FIG. 3, external pins are not required. Depending on the embodiment, the signals that are otherwise provided to the pins could be routed internally to communicate with logic or devices within the integrated circuit. For example, the synchronize signal may be output to internal logic such as an embedded logic tester (tests non-memory elements in the integrated circuit). The synchronize signal alerts the logic tester that the BIST controllers have brought the memories to a desirable state (e.g., all 0's) for testing logic elements. The logic tester then performs tests on logic elements. When completed, the logic tester issues a resume signal to the one or more BIST controllers so that additional memory testing can proceed. The above embodiment uses the same or analogous structures to those depicted in FIG. 3, but the communication is internal within the integrated circuit.

The above sample embodiment demonstrates that the synchronize signal and the resume signal have a wide variety of uses. Their use is not limited to parametric tests such as retention or IDDQ tests of the memories. For some uses a resume signal is not necessary. One example is during power-up of a device. It may be desirable on power-up to initialize the memory on the device's integrated circuit to a known value, such as all 0's. The BIST controllers can perform that initialization. A synchronization signal is then issued when memory initialization is complete, allowing other system operations of the device to proceed. In this example, no resume signal is ever issued.

Memory testing using synchronization states is not limited to retention or IDDQ tests. For example, it may be useful for a particular memory test to first have the memory loaded with a certain pattern, such as a 1-0-1 pattern. When the BIST controllers have finished filling the memory with that pattern a synchronization signal is issued. The rest of the test, whatever that might be, may then begin.

Figure 7:
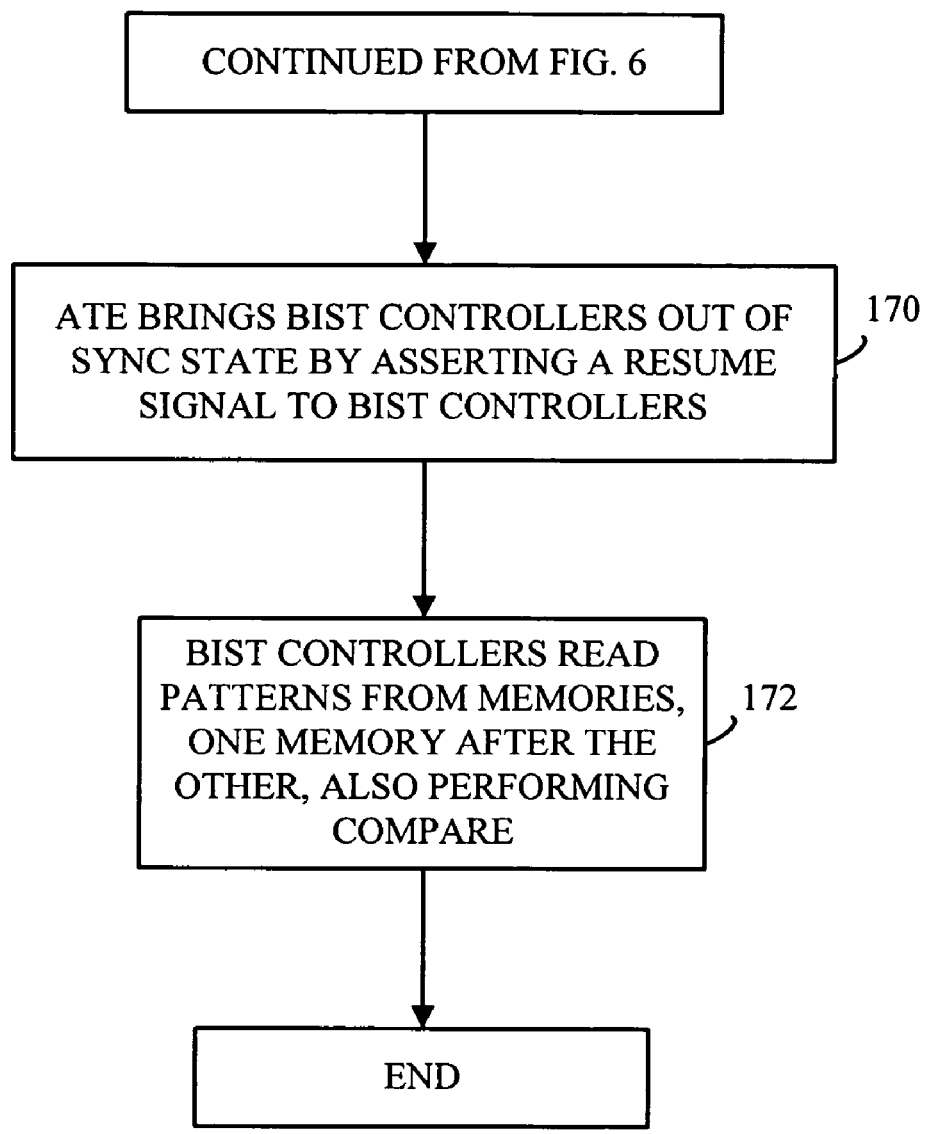
FIG. 7 is a flow chart of a method illustrating additional process blocks that may be used in conjunction with FIG. 6.

Sequentially interleaved testing is not restricted to the method shown in FIGS. 6 and 7. Generally, a BIST controller may be generated to perform almost any desired sequential algorithm in a sequentially interleaved manner. The controller states for the non-interleaved sequential case are generated. Then the states are sorted into the interleaved sequence.

Further, although finite state machines are depicted in FIG. 3, other structures may be substituted. One skilled in the art will recognize that there are other ways of causing controllers to enter and exit states. For example, combinational logic, including gates, combinations of gates or devices, may be used instead.

In view of the many possible embodiments to which the principles of our invention may be applied, it should be recognized that the illustrated embodiments are only examples and should not be taken as a limitation on the scope of the invention. Rather, the scope of the invention is defined by the following claims. We therefore claim as our invention all that comes within the scope of these claims.

We claim:

1. A circuit for testing multiple memories, comprising:
   a first BIST controller within an integrated circuit, wherein the first BIST controller is coupled with at least a first memory, the first BIST controller comprising a BIST address port for coupling the first BIST controller to the first memory;
   a second BIST controller within the integrated circuit, wherein the second BIST controller is coupled with at least a second memory;
   a third BIST controller within the integrated circuit, wherein the second BIST controller is coupled with at least a third memory;
   a fourth BIST controller within the integrated circuit, wherein the fourth BIST controller is coupled with at least a fourth memory;
   a first resume input on the integrated circuit for receiving a first resume signal, wherein the first resume input is coupled in parallel to at least the first BIST controller and the second BIST controller, wherein the first BIST controller is responsive to the first resume signal to resume testing of the first memory and the second BIST controller is responsive to the first resume signal to resume testing of the second memory; and
   a second resume input on the integrated circuit for receiving a second resume signal, wherein the second resume input is coupled in parallel to at least the third BIST controller and the fourth BIST controller, wherein the third BIST controller is responsive to the second resume signal to resume testing of the third memory and the fourth BIST controller is responsive to the second resume signal to resume testing of the fourth memory.

2. The circuit of claim 1, wherein the first resume input and the second resume input are external resume pins on a perimeter of the integrated circuit.

3. The circuit of claim 2, further including automated test equipment coupled to the external resume pins, wherein the automated test equipment controls the at least two of the first, second, third, and fourth BIST controllers by activating the external resume pins.

4. The circuit of claim 1, wherein the first resume input and the second resume input are internal inputs within the integrated circuit.

5. The circuit of claim 1, wherein at least two of the first, second, third, and fourth BIST controllers each comprise a synchronization output.

6. The circuit of claim 4, further comprising a signal combiner within the integrated circuit coupled with the synchronization outputs of the at least two of the first, second, third, and fourth BIST controllers, the signal combiner having an output that is activated when a desired number of synchronization outputs from the at least two of the first, second, third, and fourth BIST controllers are activated.

7. The circuit of claim 6, wherein the signal combiner is a logical AND of the synchronization outputs from the at least two of the first, second, third, and fourth BIST controllers.

8. The circuit of claim 1, wherein the first, second, third, and fourth memories are embedded in the integrated circuit, each of the first, second, third, and fourth memories comprising:
   a plurality of memory words for storing data;
   an address port for identifying a memory word during a read or write operation of the memory word;
   a data port that receives data to be written to the memory word during a write operation; and
   an output port to provide the memory word during a read operation.

9. The circuit of claim 1, wherein the first, second, third, and fourth memories are external to the integrated circuit, each of the first, second, third, and fourth memories comprising:
   a plurality of memory words for storing data;
   an address port for identifying a memory word during a read or write operation of the memory word;
   a data port that receives data to be written to the memory word during a write operation; and
   an output port to provide the memory word during a read operation.

10. The circuit of claim 1, wherein the at least two of the first, second, third, and fourth BIST controllers comprise a finite state machine.

11. The circuit of claim 10, wherein a synchronous output of at least one of the at least two of the first, second, third, and fourth BIST controllers is activated when the finite state machine is in a synchronous state.

12. The circuit of claim 11, wherein the synchronous state is user-definable.

13. The circuit of claim 1, wherein the memories are selected from a set comprising one or more of the following: a dynamic RAM, a static RAM, and a ROM.

14. The circuit of claim 1, further comprising at least one hold input on the integrated circuit for receiving a hold signal, wherein the at least two of the first, second, third, and fourth BIST controllers are responsive to the hold signal on the at least one hold input to enter an idle state.

15. The circuit of claim 14, wherein the at least one hold input is an external hold pin on a perimeter of the integrated circuit.

16. The circuit of claim 14, wherein the at least one hold input is an internal hold input within the integrated circuit.

17. A method of testing multiple memories, comprising:
 providing a first BIST controller within an integrated circuit, the first BIST controller coupled with a first group of memories, wherein the first BIST controller comprises an additional second BIST controller that is coupled with a second group of memories;
 using the first BIST controller, performing a first phase of a memory test on the first group of memories;
 upon completion of the first phase of the memory test in the first BIST controller, entering an idle state, wherein the first BIST controller enters the idle state under its own initiative;
 using the second BIST controller, performing a first phase of a memory test on the second group of memories, independent of the first BIST controller;
 upon completion of the first phase of the memory test in the second BIST controller, entering an idle state, wherein the second BIST controller enters the idle state under its own initiative;
 coupling a first resume input on the integrated circuit with the first BIST controller and a second resume input on the integrated circuit with the second BIST controller, wherein the first resume input and the second resume input each comprise an input pin to the integrated circuit, and wherein a first resume signal on the first resume input and a second resume signal on the second resume input are each asserted through channels between automated test equipment (ATE) and the integrated circuit; and
 in response to activation of the first and second resume inputs, exiting the idle state in the first and second BIST controllers.

18. The method of claim 17, further comprising coupling the first and second BIST controllers with a combined output, wherein the combined output is activated when the first and second BIST controllers enter the idle state.

\* \* \* \* \*